(12) United States Patent
Fukui

(10) Patent No.: US 7,006,200 B2
(45) Date of Patent: Feb. 28, 2006

(54) SUBSTRATE EXPOSURE SYSTEM (75) Inventor: Takashi Fukui, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 119 days.

(21) Appl. No.: 10/808,462

(22) Filed: Mar. 25, 2004

(65) Prior Publication Data
US 2004/0189973 A1 Sep. 30, 2004

(30) Foreign Application Priority Data
Mar. 25, 2003 (JP) .............................. 2003-083124

(51) Int. Cl.
G03B 27/58 (2006.01)
G03B 27/42 (2006.01)
(52) U.S. Cl. .......................... 355/72; 355/53
(58) Field of Classification Search .................. None
See application file for complete search history.

(56) References Cited

U.S. PATENT DOCUMENTS

2004/0130691 A1 * 7/2004 Boonman et al. ............. 355/53

* cited by examiner

Primary Examiner—Peter B. Kim
(74) Attorney, Agent, or Firm—Sughrue Mion, PLLC (57) ABSTRACT A substrate k1 transported to a measurement position Pa by a substrate transport unit 10A is measured by a measuring head moved to a substrate-measuring position Qa by the drive of a measuring head-moving unit. At the same time, a substrate k2 transported to an exposure position Rb by a substrate transport unit 10B is exposed by an exposure head moved to a substrate-exposing position Sb by the drive of an exposure head-moving unit. Then, the substrate k1 transported to an exposure position Ra by the substrate transport unit 10A is exposed by the exposure head moved to a substrate-exposing position Sa by the drive of the exposure head-moving unit. At the same time, the next substrate k3 transported to a measurement position Pb by the substrate transport unit 10B is measured by the measuring head moved to a substrate-measuring position Qb by the drive of the measuring head-moving unit.

6 Claims, 12 Drawing Sheets

| SUBSTRATE SUPPLY/ RECOVERY DEVICE | SUPPLY/ RECOVERY OF SUBSTRATE | SUPPLY SUBSTRATE K1 | | RECOVER SUBSTRATE K1 SUPPLY SUBSTRATE K2 | | RECOVER SUBSTRATE K2 SUPPLY SUBSTRATE K3 | | RECOVER SUBSTRATE K3 SUPPLY SUBSTRATE K4 | | RECOVER SUBSTRATE K4 SUPPLY SUBSTRATE K5 | |
|---|---|---|---|---|---|---|---|---|---|---|---|
| | STEPS | ① | ② | ③ | ④ | ⑤ | ⑥ | ⑦ | ⑧ (SIMILAR TO ④) | ⑨ (⑤) | |
| POSITION OF SUBSTRATE TRANSPORT MEANS A | SUBSTRATE ATTACHING/ DETACHING POSITION Da | MOUNT SUBSTRATE K1 | | | | RECOVER SUBSTRATE K1 | MOUNT SUBSTRATE K3 | | | RECOVER SUBSTRATE K3 | MOUNT SUBSTRATE K5 |
| | MEASUREMENT POSITION Pa | | SUBSTRATE K1 | TRANSPORT SUBSTRATE K1 | SUBSTRATE K1 | | | | | | |
| | EXPOSURE POSITION Rb | | | | | | | | | | |
| POSITION OF SUBSTRATE TRANSPORT MEANS B | SUBSTRATE ATTACHING/ DETACHING POSITION Db | WAITING | WAITING | MOUNT SUBSTRATE K2 | | | | RECOVER SUBSTRATE K2 | MOUNT SUBSTRATE K4 | | |
| | MEASUREMENT POSITION Pb | | | | SUBSTRATE K2 | TRANSPORT SUBSTRATE K2 | SUBSTRATE K2 | | | SUBSTRATE K4 | TRANSPORT SUBSTRATE K4 |
| | EXPOSURE POSITION Rb | | | | | | | | | | |
| POSITION OF MEASURING HEAD | SUBSTRATE-MEASURING POSITION Qa | | MEASURE SUBSTRATE K1 | | | | MEASURE SUBSTRATE K3 | | | MEASURE SUBSTRATE K4 | |
| | SUBSTRATE-MEASURING POSITION Qb | | | | MEASURE SUBSTRATE K2 | | | | | | |
| POSITION OF EXPOSURE HEAD | SUBSTRATE-EXPOSING POSITION Qa | | | | EXPOSE SUBSTRATE K1 | | | | | EXPOSE SUBSTRATE K3 | |
| | SUBSTRATE-EXPOSING POSITION Qb | | | | | | EXPOSE SUBSTRATE K2 | | | | |

SUBSTRATE EXPOSURE SYSTEM

BACKGROUND OF THE INVENTION

1. Field of the Invention

The present invention relates to a substrate exposure system and, more specifically, relates to a substrate exposure system in which a substrate to be a subject of exposure is sequentially transported to a measurement position and an exposure position to be exposed.

2. Description of the Related Art

Heretofore, a substrate exposure system in which one substrate to be a subject of exposure is sequentially transported to a measurement position and an exposure position to be measured and exposed, has been known (e.g., Patent Literature 1). In the fabrication of a two-layer substrate using the substrate exposure system, when photoresist in a second layer is exposed, the position measurement of a plurality of conducting holes for providing the continuity between a circuit pattern in a first layer and that in the second layer is performed, and then, based on position data representing the positions of the conducting holes obtained from this position measurement, the exposure position of the circuit pattern is modified, thus exposing the photoresist.

(Patent Literature 1)

Japanese Unexamined Patent Publication No. 2000-338432 Incidentally, if the number of conducting holes of the substrate increases, the time required to measure the positions of the conducting holes is elongated. For example, there are cases where the time for exposing the substrate and the time for measuring the positions of the conducting holes are almost the same. Thus, waiting time when the substrate is exposed is elongated, and there is a problem that the productivity of a substrate exposure process is lowered. Moreover, even in the case where the productivity of the substrate exposure process is improved, there is a desire to suppress the increase of cost of the system.

SUMMARY OF THE INVENTION

The present invention was accomplished in light of the above-described circumstances, and an object of the present invention is to provide a substrate exposure system in which the processing efficiency of substrate exposure can be improved while the increase of cost of the system is being suppressed.

The substrate exposure system of the present invention includes a plurality of substrate transport means each of which sequentially transports one substrate to be a subject of exposure to a measurement position and an exposure position;

one measuring head for measuring the substrate transported to the measurement position;

one exposure head for exposing the substrate transported to the exposure position;

measuring head-moving means for moving the measuring head to respective substrate-measuring positions for the respective substrates transported to the respective measurement positions of the plurality of substrate transport means; and exposure head-moving means for moving the exposure head to respective substrate-exposing positions for the respective substrates transported to the respective exposure positions of the plurality of substrate transport means.

Note that the measurement of the substrate by the measuring head may be, for example, the position measurement of a conducting hole for providing the continuity between first and second layers of the substrate.

The substrate exposure system can be structured so that surfaces of the respective substrates transported to the respective exposure positions of the plurality of substrate transport means may overlap in an exposing direction of the exposure head. Note that the exposing direction is the direction in which light for exposure emitted from the exposure head is transmitted.

The substrate exposure system further includes positional relationship-measuring means for measuring a relative positional relationship between the substrate transported to the measurement position and the measuring head moved to the substrate-measuring position. Note that the measuring head can also be used as the positional relationship-measuring means.

The substrate exposure system further includes exposure position-measuring means for measuring a positional relationship between the substrate transported to the exposure position and the exposure head moved to the substrate-exposing position.

The substrate exposure system of the present invention includes measuring head-moving means for moving one measuring head to respective substrate-measuring positions for respective substrates transported to respective measurement positions of a plurality of substrate transport means, and exposure head-moving means for moving one exposure head to respective substrate-exposing positions for respective substrates transported to respective exposure positions of the plurality of substrate transport means. Accordingly, the measuring head and the exposure head can be used among the plurality of substrate transport means, and the increase of cost of the system can be suppressed. In addition, the measurement by the measuring head and the exposure by the exposure head can be simultaneously performed on respective substrates transported by different substrate transport means from each other. Therefore, without waiting until the measurement of a substrate by the measuring head is completed, another substrate can be exposed by the exposure head. Thus, waiting time when a substrate is exposed can be considerably shortened, and the processing efficiency of substrate exposure can be improved.

Moreover, if the substrate exposure system is structured so that the surfaces of the respective substrates transported to the respective exposure positions of the plurality of substrate transport means may overlap in the exposing direction of the exposure head, the respective substrates transported to the respective measurement positions of the plurality of substrate transport means can be placed close to each other in the exposing direction because the thicknesses of the substrates are small. Therefore, the movement distance of the exposure head when each substrate is exposed can be reduced, and the movement direction of the exposure head when each substrate is exposed can be limited to only one direction. This makes it possible to improve position repeatability when the exposure head is moved and to simplify a movement mechanism of the exposure head. Furthermore, for example, when the thicknesses of substrates have been changed, the change in substrate thickness can be dealt with by moving the exposure head in the movement direction by the amount of the change in substrate thickness. Thus, the mechanism to move the exposure head can also be used as an interval changing mechanism between a substrate and the exposure head, which is required with the change in substrate thickness. Accordingly, the increase of cost of the system can be further suppressed.

Further, if the substrate exposure system includes positional relationship-measuring means for measuring the relative positional relationship between a substrate transported to the measurement position and the measuring head moved to the substrate-measuring position, for example, position data representing the positions of the conducting holes on the substrate measured by the measuring head can be modified into position data which might have been obtained from the measurement by the measuring head in the case where the relative positional relationship between the substrate and the measuring head had been a predetermined positional relationship, based on the positional relationship obtained from the measurement by the positional relationship-measuring means. That is, position data obtained every time the above-described measurement is performed can be represented on the same coordinates set in the case where the substrate transport means and the measuring head have a predetermined positional relationship.

Furthermore, if the substrate exposure system includes exposure position-measuring means for measuring the relative positional relationship between a substrate transported to the exposure position and the exposure head moved to the substrate-exposing position, for example, an exposure position of a circuit pattern on the substrate by the exposure head can be modified into the position on the substrate where the circuit pattern might have been exposed in the case where the relative positional relationship between the substrate and the exposure head had been a predetermined positional relationship, based on the positional relationship measured by the positional relationship-measuring means. Thus, the circuit pattern can be exposed onto a more accurate position on the substrate.

DESCRIPTION OF THE PREFERRED EMBODIMENT

Figure 1A:
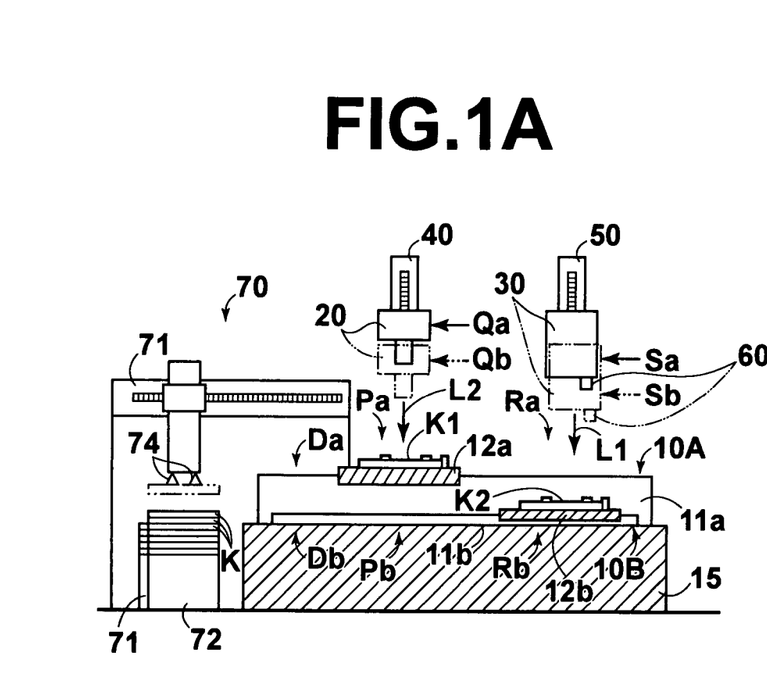
FIGS. 1A to 1C are diagrams showing a schematic constitution of a substrate exposure system according to an embodiment of the present invention.
Figure 1B:
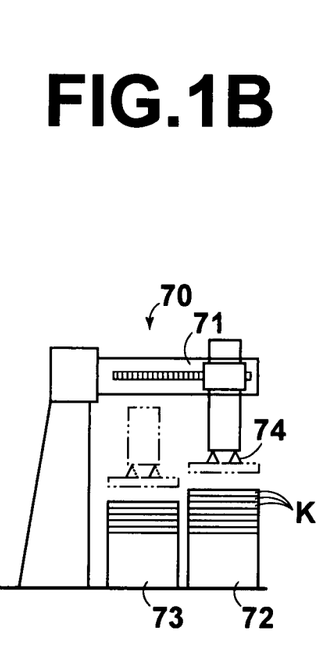
Figure 1C:
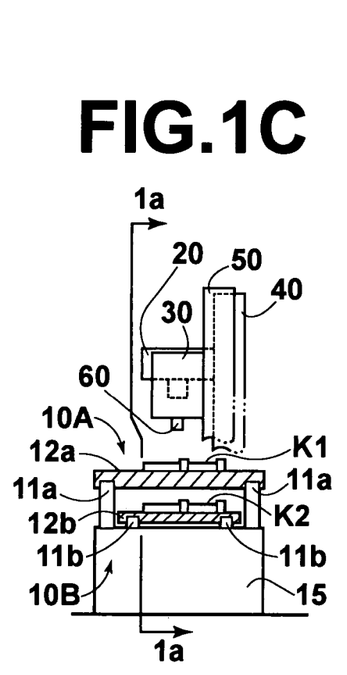
Figure 2:
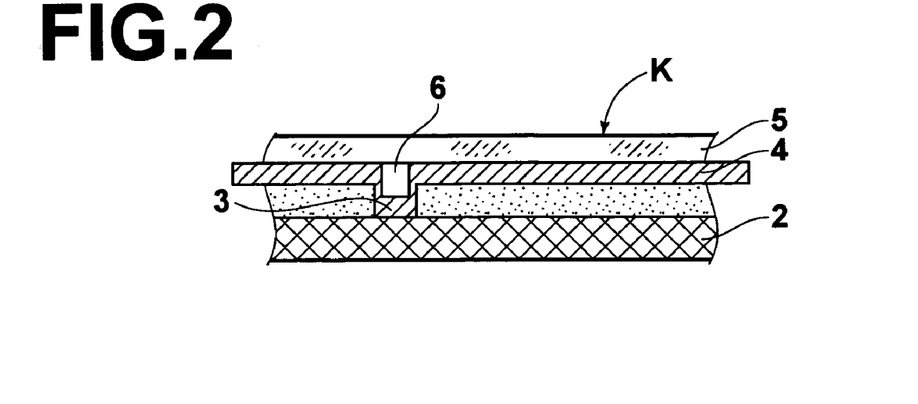
FIG. 2 is a cross-sectional view showing a cross section of a substrate.
Figure 3:
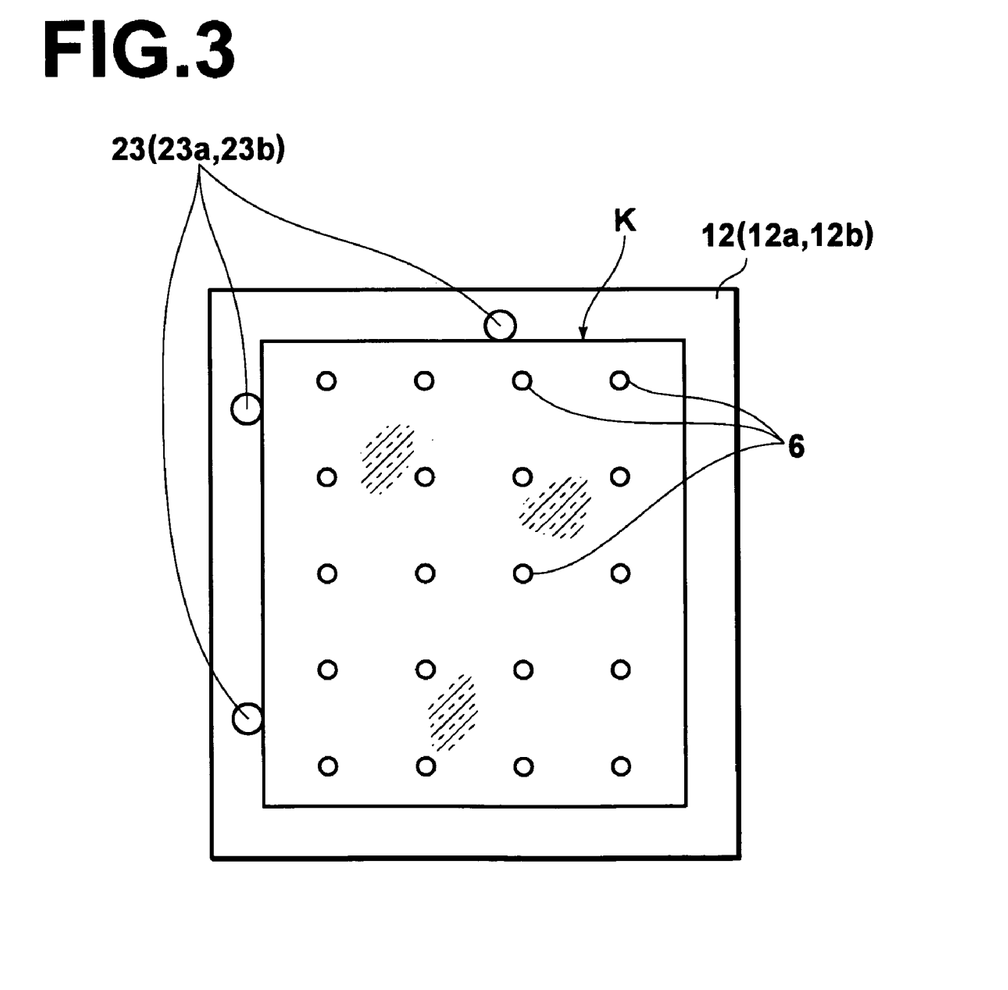
FIG. 3 is a plan view showing a situation where a substrate is placed on a transport table.

Hereinafter, an embodiment of the present invention will be described using the accompanying drawings. FIG. 1A is a front view showing schematic constitutions of a substrate exposure system of the present invention and a substrate supply/recovery device apposed to the foregoing system. FIG. 1B is a side view of the system viewed from the measuring head side. FIG. 1C is a side view of the system viewed from the exposure head side. FIG. 2 is a cross-sectional view showing a cross section of a substrate. FIG. 3 is a plan view showing a situation where a substrate is placed on a transport table. FIGS. 4 to 12 are views showing steps in a substrate exposure process using the substrate exposure system in order. FIG. 13 is a process chart showing steps in the substrate exposure process using the substrate exposure system in order. Note that transport tables and substrate transport units in FIG. 1A represent cross section 1a–1a of FIG. 1C.

As shown in FIGS. 1A to 1C, the substrate exposure system according to the embodiment of the present invention includes a plurality of substrate transport units, each of which sequentially transports one substrate to be a subject of exposure to a measurement position and an exposure position, i.e., a substrate transport unit 10A for sequentially transporting one substrate K (K1) to be a subject of exposure to a measurement position Pa and an exposure position Ra and a substrate transport unit 10B for sequentially transporting one substrate K (K2) to be a subject of exposure to a measurement position Pb and an exposure position Rb. The substrate exposure system further includes one measuring head 20 which is equipped with, for example, a CCD camera or the like and which measures the substrates K1 and K2 transported to the measurement positions Pa and Pb, one exposure head 30 for exposing the substrates K1 and K2 transported to the exposure positions Ra and Rb, a measuring head-moving unit 40 for moving the measuring head 20 to respective substrate-measuring positions Qa and Qb for the respective substrates K1 and K2 transported to the respective measurement positions Pa and Pb of the plurality of substrate transport units 10A and 10B, and an exposure head-moving unit 50 for moving the exposure head 30 to respective substrate-exposing positions Sa and Sb for the respective substrates K1 and K2 transported to the respective exposure positions Ra and Rb of the plurality of substrate transport units 10A and 10B.

Incidentally, the substrate exposure system is structured so that the surfaces of the respective substrates K1 and K2 transported to the respective exposure positions Ra and Rb of the substrate transport units 10A and 10B may overlap in the exposing direction L1 of the exposure head 30. Here, the exposing direction is the vertical direction, and the substrates K1 and K2 overlap the exposure head 30 at the exposure positions Ra and Rb in the vertical direction. Further, the exposure head-moving unit 50 moves the exposure head 30 in the vertical direction to place the exposure head 30 at the substrate-exposing positions Sa and Sb.

Moreover, the surfaces of the respective substrates K1 and K2 transported to the respective measurement positions Pa and Pb of the substrate transport units 10A and 10B are also arranged so as to overlap in the measuring direction L2 of the measuring head 20. That is, the substrates K1 and K2 overlap the measuring head 20 at the measurement positions Pa and Pb in the vertical direction. Further, the measuring head-moving unit 40 moves the measuring head 20 in the vertical direction to place the measuring head 20 at the substrate-measuring positions Qa and Qb.

The substrates K1 and K2 are supplied from a large number of substrates K stacked and stocked in a supply stocker 72 to be described later. All of these substrates are based on the same specifications. Each of the substrates K based on the same specifications is fabricated as a substrate having two or more layers. As shown in FIG. 2, a circuit pattern 3 in a first layer has been already formed on a base plate 2 of the substrate K, and a copper foil layer 4 and a photoresist layer 5 for the formation of a circuit pattern in a second layer have been stacked on the circuit pattern 3. Moreover, conducting holes 6 for providing the continuity between the circuit pattern 3 in the first layer and a circuit pattern to be formed in the second layer after this have been already formed. Note that these conducting holes 6 can be observed and measured through the transparent photoresist layer 3.

The substrate transport units 10A and 10B are structured so as to have a nested structure (refer to FIG. 1C). The substrate transport unit 10A includes two wide rails 11a, a transport table 12a on which the substrate K1 is mounted and which transports the substrate K1 to the measurement position Pa and the exposure position Ra, and table-driving means (not shown) for moving the transport table 12a on the rails 11a. Meanwhile, the substrate transport unit 10B includes two rails 11b arranged between the two rails 11a of the substrate transport unit 10A, a transport table 12b, and table-driving means (not shown). Note that the positional relationship between the substrate transport units 10A and 10B is defined by individually fixing the two rails 11a and the two rails 11b to a base stage 15, and that the substrate transport units 10A and 10B have a nested structure as described above.

As shown in FIG. 3, the measuring head 20 measures the positions of the conducting holes 6 of a substrate K which are arranged in the form of a 4×5 matrix using the CCD camera. Furthermore, the measuring head 20 also measures the positional relationship between a substrate K transported to the measurement position Pa and the measuring head 20 moved to the substrate-measuring position Qa and the positional relationship between a substrate K transported to the measurement position Pb and the measuring head 20 moved to the substrate-measuring position Qb. That is, as shown in the abovementioned FIG. 3, the measuring head 20 is also used as positional relationship-measuring means, and measures the positional relationship between a substrate K transported to a measurement position and the measuring head 20 moved to a substrate-measuring position by measuring the positions of three reference pins 23 (23a or 23b) in the state where the substrate K is placed on a transport table 12 (12a or 12b) while being touched to the reference pins 23 (23a or 23b) on the transport table 12 (12a or 12b).

Moreover, the exposure head 30 is integrally equipped with an exposure position-measuring camera 60 made up of a CCD camera or the like, which is exposure position-measuring means for measuring the positional relationship between a substrate K transported to the exposure position Ra and the exposure head 30 moved to the substrate-exposing position Sa and the positional relationship between a substrate K transported to the exposure position Rb and the exposure head 30 moved to the substrate-exposing position Sb.

Incidentally, the substrate supply/recovery device 70 for supplying the substrates K to the substrate transport units 10A and 10B and for recovering the exposed substrates K from the substrate transport units 10A and 10B is apposed to the substrate exposure system. The substrate supply/recovery device 70 includes the supply stocker 72 for stocking substrates K to be supplied to the substrate exposure system, a recovery stocker 73 for stocking exposed substrates K on which an exposure process has been performed by the substrate exposure system, and a transport arm unit 71 with three axes of X, Y, and Z for taking a substrate K out of the supply stocker 72 to supply the substrate K to the substrate exposure system and recovering an exposed substrate K from the substrate exposure system into the stocker 73. Note that the transport arm unit 71 has a vacuum holding unit 74 for vacuum-holding a substrate K, on the tip of a transport shaft constituted by X, Y, and Z.

For driving methods of the substrate transport units 10A and 10B, the measuring head-moving unit 40, the exposure head-moving unit 50, the transport arm unit 71, and the like, a rigid ball rail system, a high-accuracy feed system using a ball screw, and the like, which have been heretofore known, can be employed.

Next, operations of the above-described embodiment will be described in time series.

(1) <<Setting and Transport to Measurement Position Pa for Substrate K1>>

Figure 4:
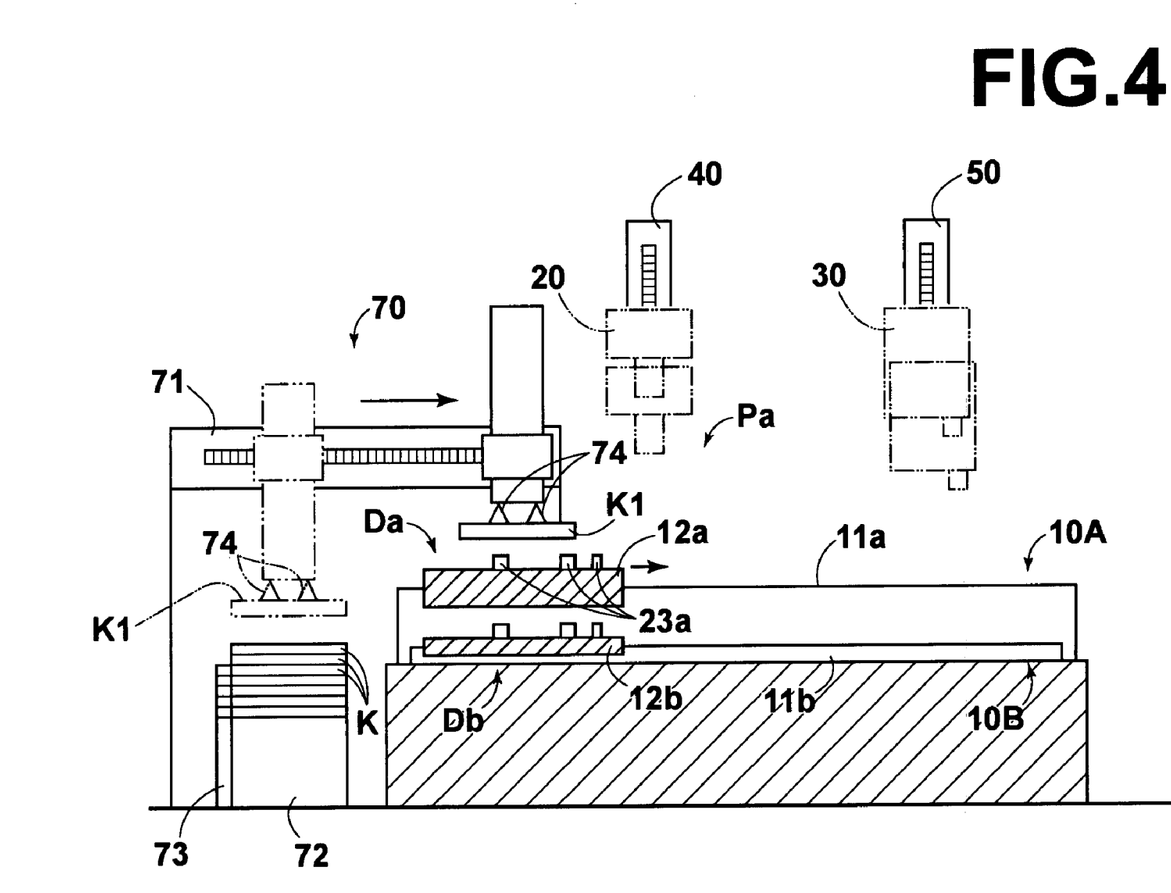
FIG. 4 is a view showing a step in a substrate exposure process by the substrate exposure system.

As shown in FIG. 4, first, the transport arm unit 71 vacuum-holds a substrate K1 positioned on the top of the substrates stacked in the stocker 72 with the vacuum holding unit 74 to take the substrate K1 out of the supply stocker 72. Then, the substrate K1 is transported to the transport table 12a positioned at a substrate attaching/detaching position Da and placed at a predetermined position while being touched to the three reference pins 23a on the transport table 12a (refer to FIG. 3). The transport table 12a vacuum-holds the substrate K1 placed at the predetermined position, and the substrate K1 is fixed on the transport table 12a.

The transport table 12a having the substrate K1 vacuum-held and fixed at the predetermined position is transported along the rails 11a by the drive of the table-driving means to be placed at the measurement position Pa.

(2) <<Measurement of Substrate K1 by Measuring Head 20>>

Figure 5:
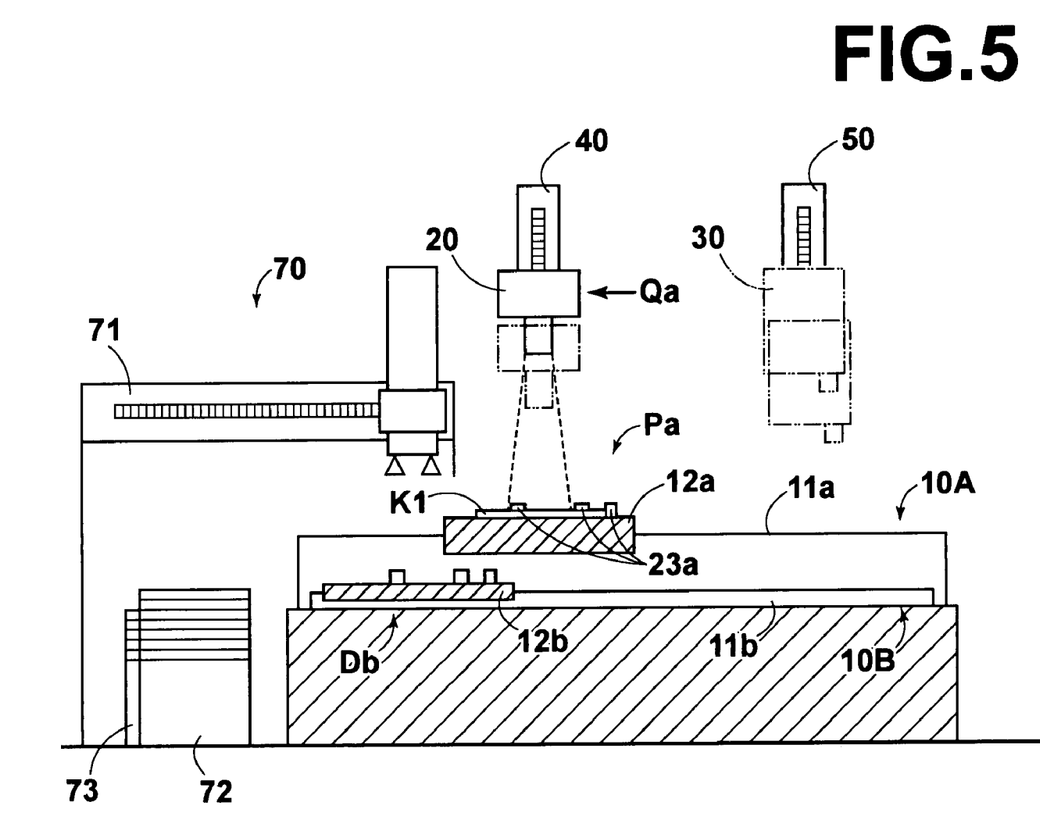
FIG. 5 is a view showing a step in the substrate exposure process by the substrate exposure system.

Next, as shown in FIG. 5, the measuring head 20 is moved to the substrate-measuring position Qa by the measuring head-moving unit 40 and measures the substrate K1 on the transport table 12a placed at the measurement position Pa. Here, the measuring head 20 measures the positions of the conducting holes 6 arranged in the form of a 4×5 matrix and the three reference pins 23a (refer to FIG. 3). Incidentally, the position measurement of the reference pins 23a provides reference positions of the substrate K1, i.e., the positions on the substrate K1 where the three reference pins 23a are touched. Accordingly, the positional relationship between the substrate K1 and the measuring head 20 and that between the transport table 12a and the measuring head 20 can be determined by this measurement.

From the above-described measurement, position coordinate data of the conducting holes 6 and positional relationship data representing the positional relationship between the substrate K1 positioned at the measurement position Pa and the measuring head 20 positioned at the substrate-measuring position Qa are obtained. Furthermore, based on the positional relationship data, the measuring head 20 modifies the position coordinate data into position coordinate data which might have been obtained if the positional relationship between the measuring head 20 and the substrate K1 had been a previously determined positional relationship, and outputs the modified position coordinate data to the exposure head 30.

That is, since the positional relationship between both is shifted from the previously determined positional relationship due to the movement of the measuring head 20 and the substrate K, the coordinate values of the conducting holes 6 of the substrate K measured with the measuring head 20 are modified by the amount by which the positional relationship has been shifted. This allows the resultant coordinate values to be treated as the data which might have been obtained if the measuring head 20 and the substrate K had had the previously determined positional relationship.

(3) <<Parallel Processing of Transport to Exposure Position Ra for Substrate K1, and Setting and Transport to Measurement Position Pb for Substrate K2>>

<Transport to Exposure Position Ra for Substrate K1>

Figure 6:
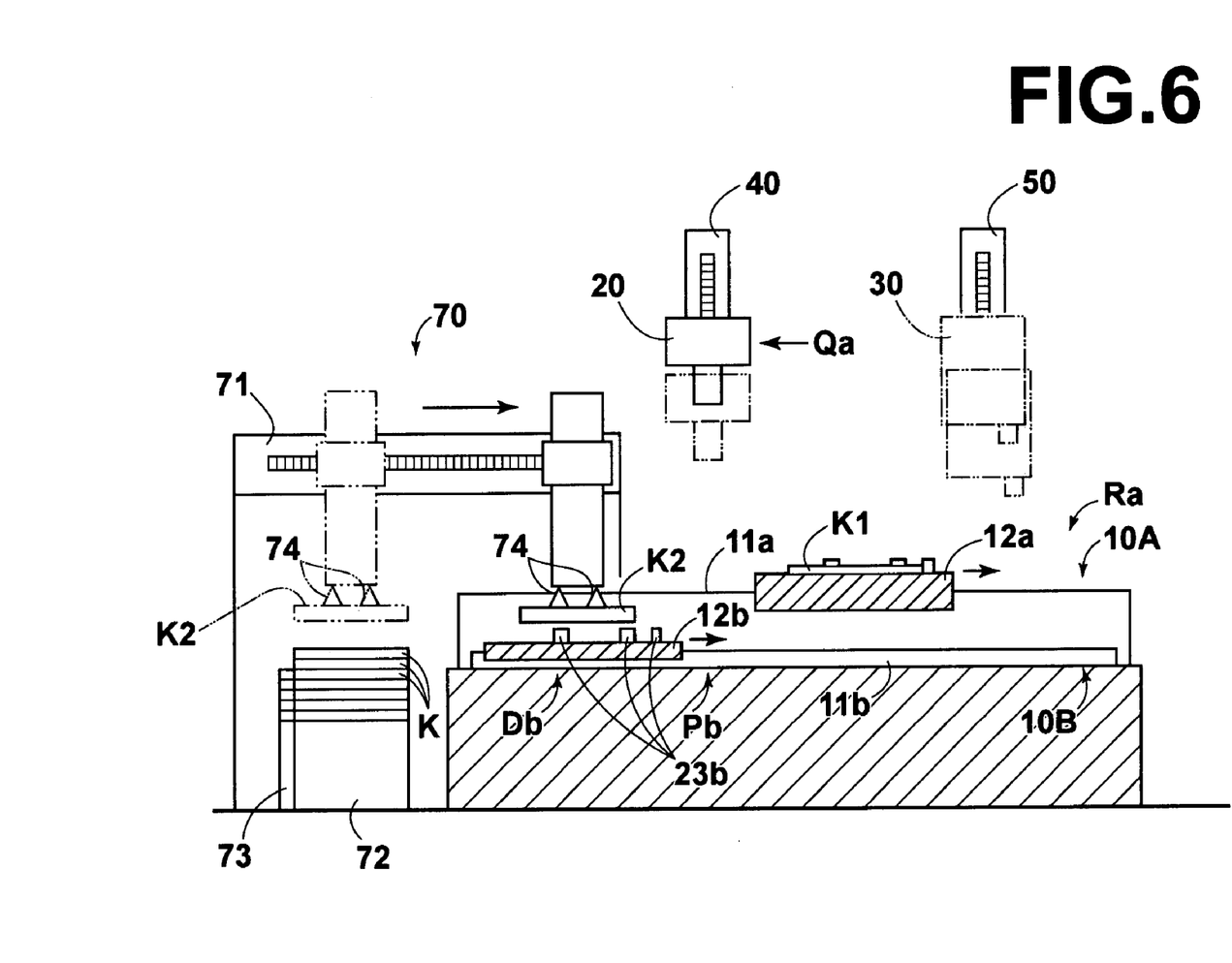
FIG. 6 is a view showing a step in the substrate exposure process by the substrate exposure system.

Next, as shown in FIG. 6, the transport table 12a having the substrate K1 vacuum-held and fixed at the predetermined position is transported to the exposure position Ra along the rails 11a by the drive of the table-driving means.

<Transport to Measurement Position Pb for Substrate K2>

In parallel to the above, as shown in the above-mentioned FIG. 6, the transport arm unit 71 vacuum-holds the substrate K2 next to the substrate K1 stocked in the supply stocker 72 with the vacuum holding unit 74 to take the substrate K2 out of the supply stocker 72. Then, the substrate K2 is transported to the transport table 12b positioned at the substrate attaching/detaching position Db and placed at a predetermined position while being touched to the three reference pins 23b on the transport table 12b. The transport table 12b vacuum-holds the substrate K2 placed at the predetermined position, and the substrate K2 is fixed on the transport table 12b.

The transport table 12b having the substrate K2 vacuum-held and fixed at the predetermined position is transported to the measurement position Pb along the rails 11b by the drive of the table-driving means.

Subsequently, the exposure of the substrate K1 by the exposure head 30 and the measurement of the substrate K2 by the measuring head 20 are executed in parallel.

(4) <<Parallel Processing of Exposure of Substrate K1 by Exposure Head 30 and Measurement of Substrate K2 by Measuring Head 20>>

<Exposure of Substrate K1 by Exposure Head 30>

Figure 7:
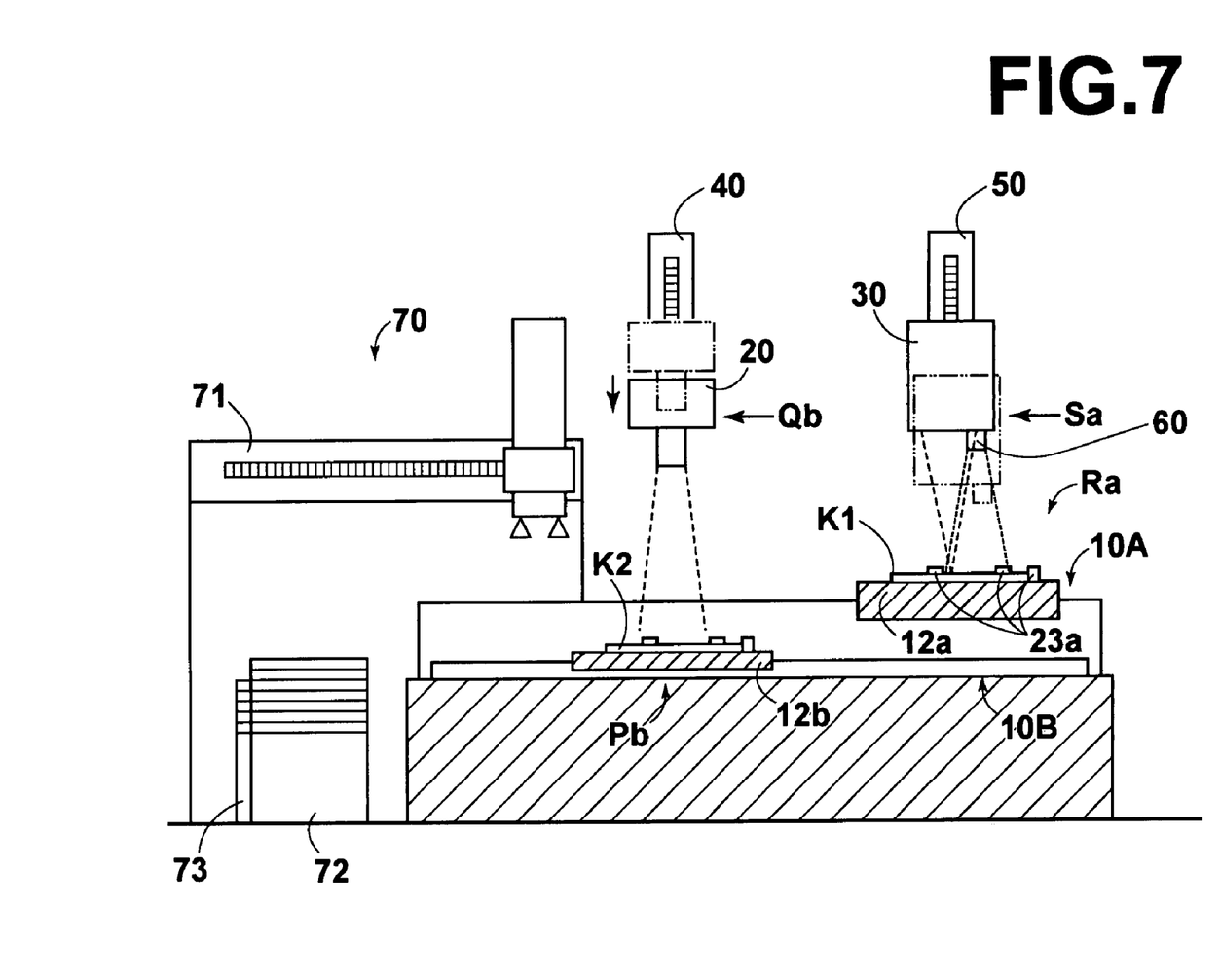
FIG. 7 is a view showing a step in the substrate exposure process by the substrate exposure system.

As shown in FIG. 7, the exposure head 30 is moved to the substrate-exposing position Sa by the exposure head-moving unit 50.

Here, the positions of the three reference pins 23a are measured by the exposure position-measuring camera 60. By this position measurement of the reference pins 23a, reference positions of the substrate K1 are measured, that is, the three positions on the substrate where the three reference pins 23a are touched are measured. Accordingly, the positional relationship between the substrate K1 and the exposure head 30 can be determined by this measurement. Based on the positional relationship obtained as described above, the exposure position of a circuit pattern on the substrate K1 is modified so that the circuit pattern may be exposed onto the position on the substrate K1 where the circuit pattern might have been exposed if the positional relationship between the exposure head 30 and the substrate K1 had been a predetermined positional relationship previously determined. Note that data representing the circuit pattern is previously inputted and stored in the exposure head 30 and that the exposure position is modified by correcting the data of the circuit pattern.

After that, the ultimate exposure position and circuit pattern are determined by the exposure head 30 based on the data representing the circuit pattern in which the exposure position has been modified and on the modified position coordinate data which represents the positions of the conducting holes 6 and which is inputted from the measuring head 20. Then, the circuit pattern is exposed onto the substrate K1 placed at the exposure position Ra.

<Measurement of Substrate K2 by Measuring Head 20>

As shown in the aforementioned FIG. 7, the measuring head 20 is moved to the substrate-measuring position Qb by the measuring head-moving unit 40 and measures the substrate K2 on the transport table 12b placed at the measurement position Pb. The measurement of the substrate K2 by the measuring head 20 performed here is similar to the measurement of the substrate K1 by the measuring head 20 described in the aforementioned section (2).

Next, the recovery of the substrate K1, the setting and transport to the measurement position Pa for a substrate K3, and the transport to the exposure position Rb for the substrate K2 are executed in parallel.

(5) <<Parallel Processing of Recovery of Substrate K1, Setting and Transport to Measurement Position Pa for Substrate K3, and Transport to Exposure Position Rb for Substrate K2>>

<Recovery of Substrate K1>

Figure 8:
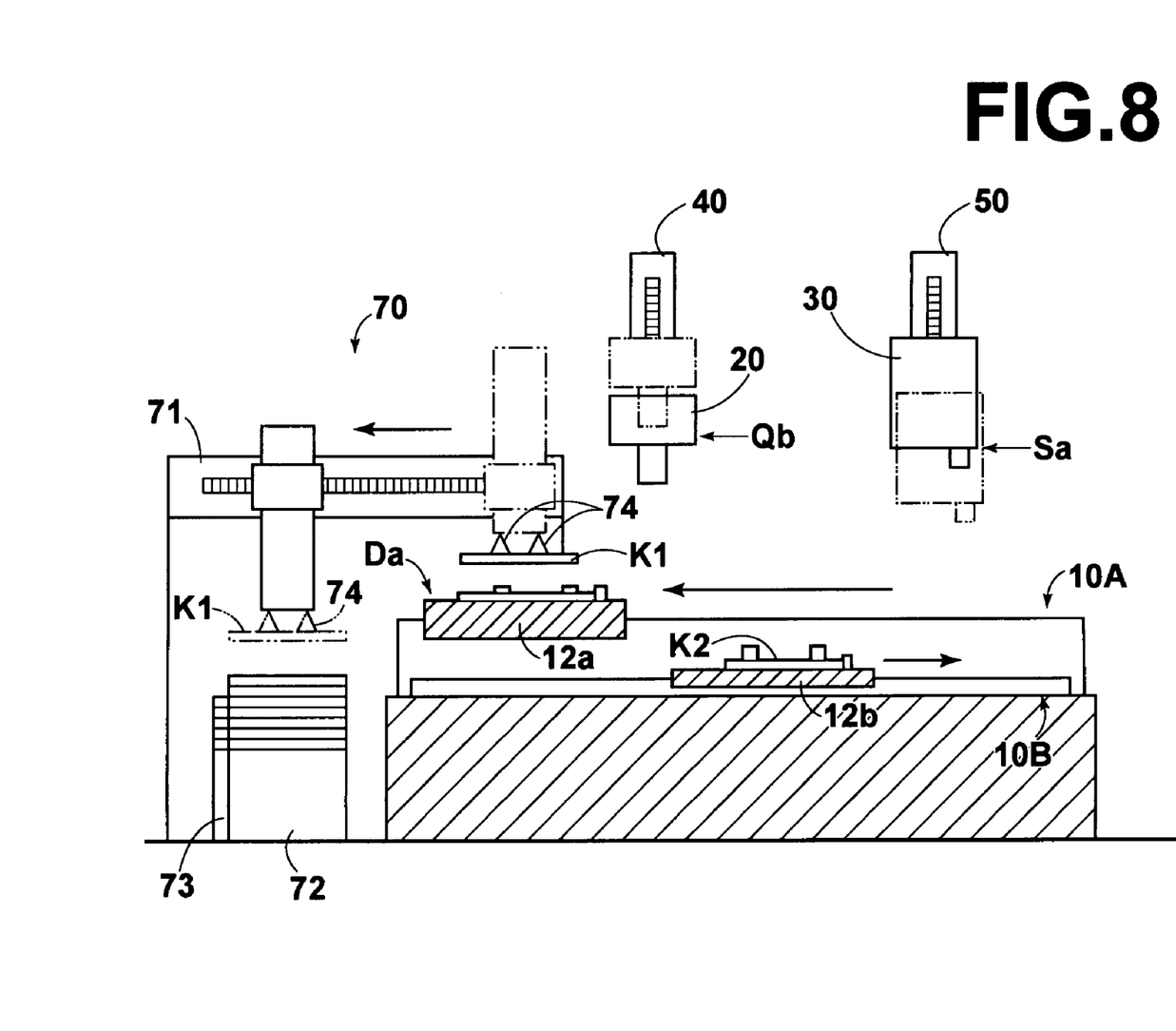
FIG. 8 is a view showing a step in the substrate exposure process by the substrate exposure system.

As shown in FIG. 8, the exposed substrate K1 on the transport table 12a, in which the exposure by the exposure head 30 has been completed, is transported to the substrate attaching/detaching position Da to be released from vacuum-holding and fixing. Thereafter, the substrate K1 is vacuum-held with the vacuum holding unit 74 of the transport arm unit 71 to be removed from the transport table 12a, and transported to be recovered into the recovery stocker 73.

<Setting and Transport to Measurement Position Pa for Substrate K3>

Figure 9:
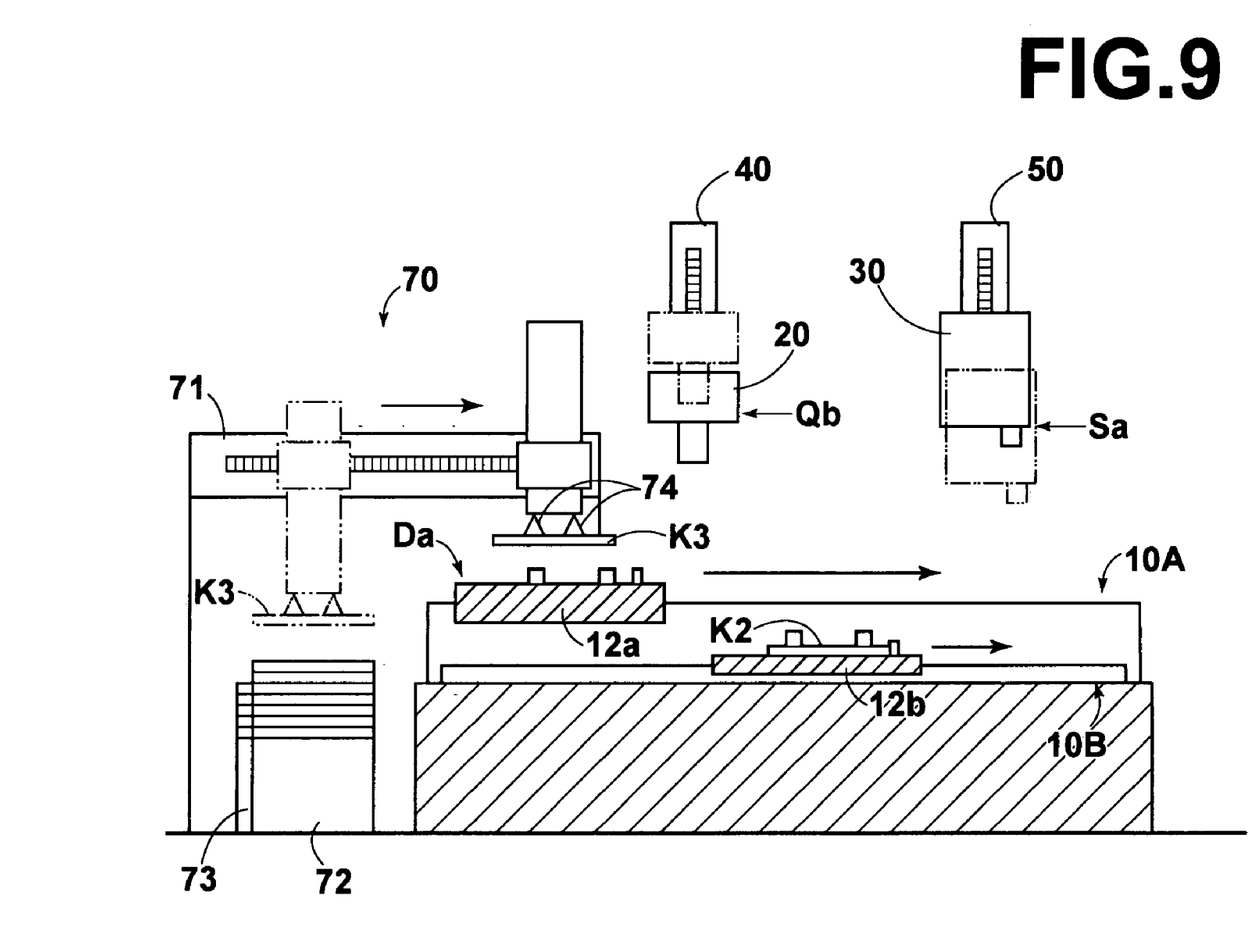
FIG. 9 is a view showing a step in the substrate exposure process by the substrate exposure system.

As shown in FIG. 9, the transport arm unit 71, which has recovered the substrate K1 into the recovery stocker 73, thereafter vacuum-holds the next substrate K3, which is stacked in the stocker 72, with the vacuum holding unit 74 to take the substrate K3 out of the supply stocker 72. Then, the substrate K3 is transported to the transport table 12a positioned at the substrate attaching/detaching position Da and placed at the predetermined position while being touched to the three reference pins 23a on the transport table 12a. The transport table 12a vacuum-holds the substrate K3 placed at the predetermined position, and the substrate K3 is fixed on the transport table 12a.

<Transport to Measurement Position Pa for Substrate K3>

After that, the transport table 12a having the substrate K3 vacuum-held and fixed at the predetermined position is transported along the rails 11a by the drive of the table-driving means to be placed at the measurement position Pa.

<Transport to Exposure Position Rb for Substrate K2>

As shown in the aforementioned FIG. 9, the substrate K2 on the transport table 12b, in which the measurement by the measuring head 20 has been completed, is placed at the exposure position Rb while being vacuum-held and fixed on the transport table 12b.

(6) <<Parallel Processing of Measurement of Substrate K3 by Measuring Head 20 and Exposure of Substrate K2 by Exposure Head 30>>

<Measurement of Substrate K3 by Measuring Head 20>

Figure 10:
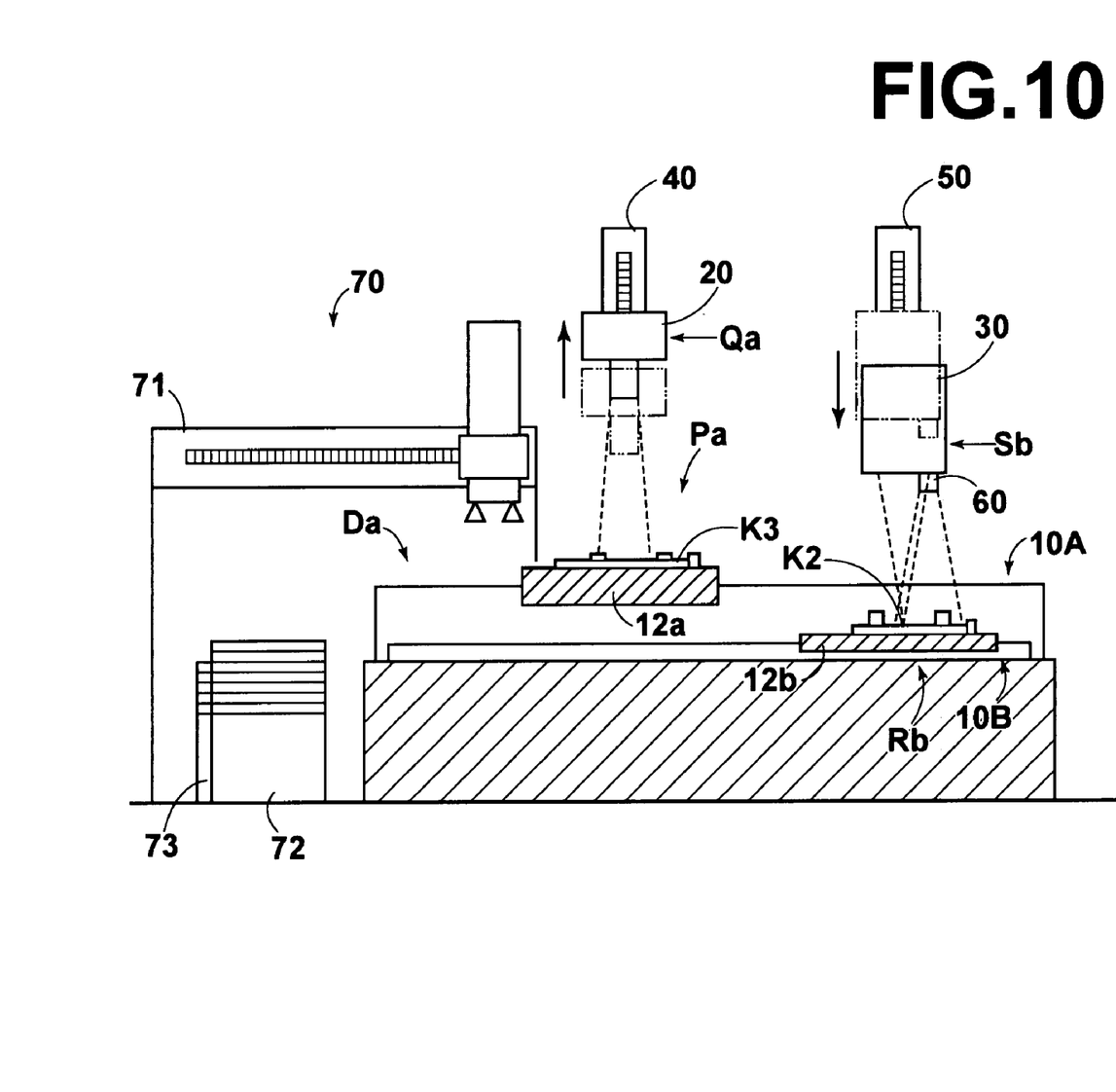
FIG. 10 is a view showing a step in the substrate exposure process by the substrate exposure system.

As shown in FIG. 10, the measuring head 20 is moved from the substrate-measuring position Qb to the substrate-measuring position Qa by the measuring head-moving unit 40. The measuring head 20 positioned at the substrate-measuring position Qa measures the substrate K3 on the transport table 12a placed at the measurement position Pa.

Subsequent operations here are similar to those of the measurement of a substrate K by the measuring head 20 described in the aforementioned sections (2) and (4).

<Exposure of Substrate K2 by Exposure Head 30>

The exposure head 30 is moved from the substrate-exposing position Sa to the substrate-exposing position Sb by the exposure head-moving unit 50.

After that, for the substrate K2 placed at the exposure position Ra, the position measurement of the three reference pins 23a by the exposure position-measuring camera 60 is performed. Then, the circuit pattern is exposed onto the substrate K2 by the exposure head 30 based on information from this position measurement and the like. Note that operations here are similar to those of the exposure of the substrate K1 by the exposure head 30 in the aforementioned section (4).

(7) <<Parallel Processing of Transport to Exposure Position Ra for Substrate K3, Recovery of Substrate K2, and Setting and Transport to Measurement Position Pb for Substrate K4>>

<Recovery of Substrate K2>

Figure 11:
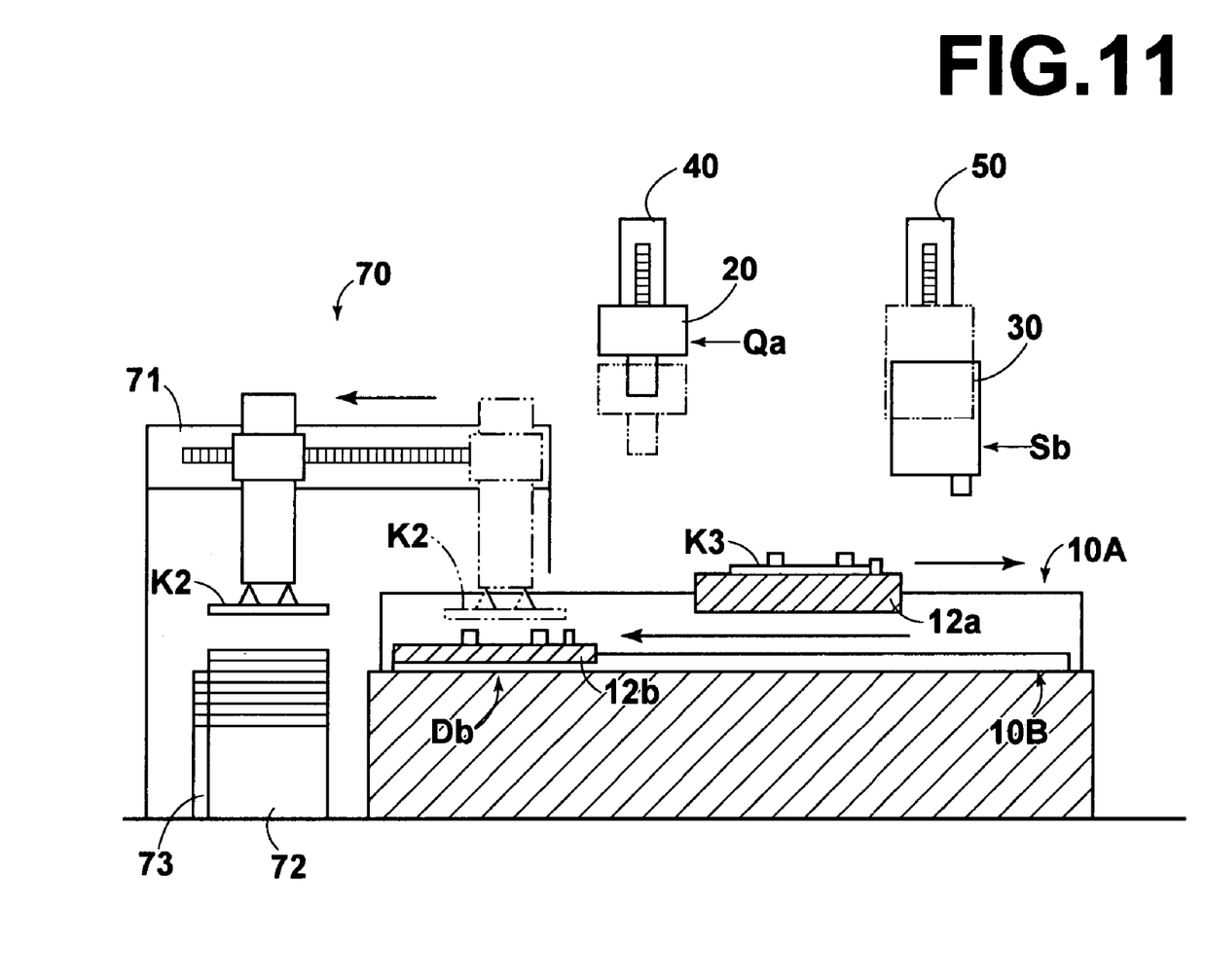
FIG. 11 is a view showing a step in the substrate exposure process by the substrate exposure system.

As shown in FIG. 11, the exposed substrate K2, in which the exposure by the exposure head 30 has been completed, is transported to the substrate attaching/detaching position Db while being vacuum-held and fixed on the transport table 12b to be released from vacuum-holding and fixing. Thereafter, the substrate K2 is vacuum-held with the vacuum holding unit 74 of the transport arm unit 71 to be removed from the transport table 12a, and transported to be recovered into the recovery stocker 73.

<Setting and Transport to Measurement Position Pb for Substrate K4>

Figure 12:
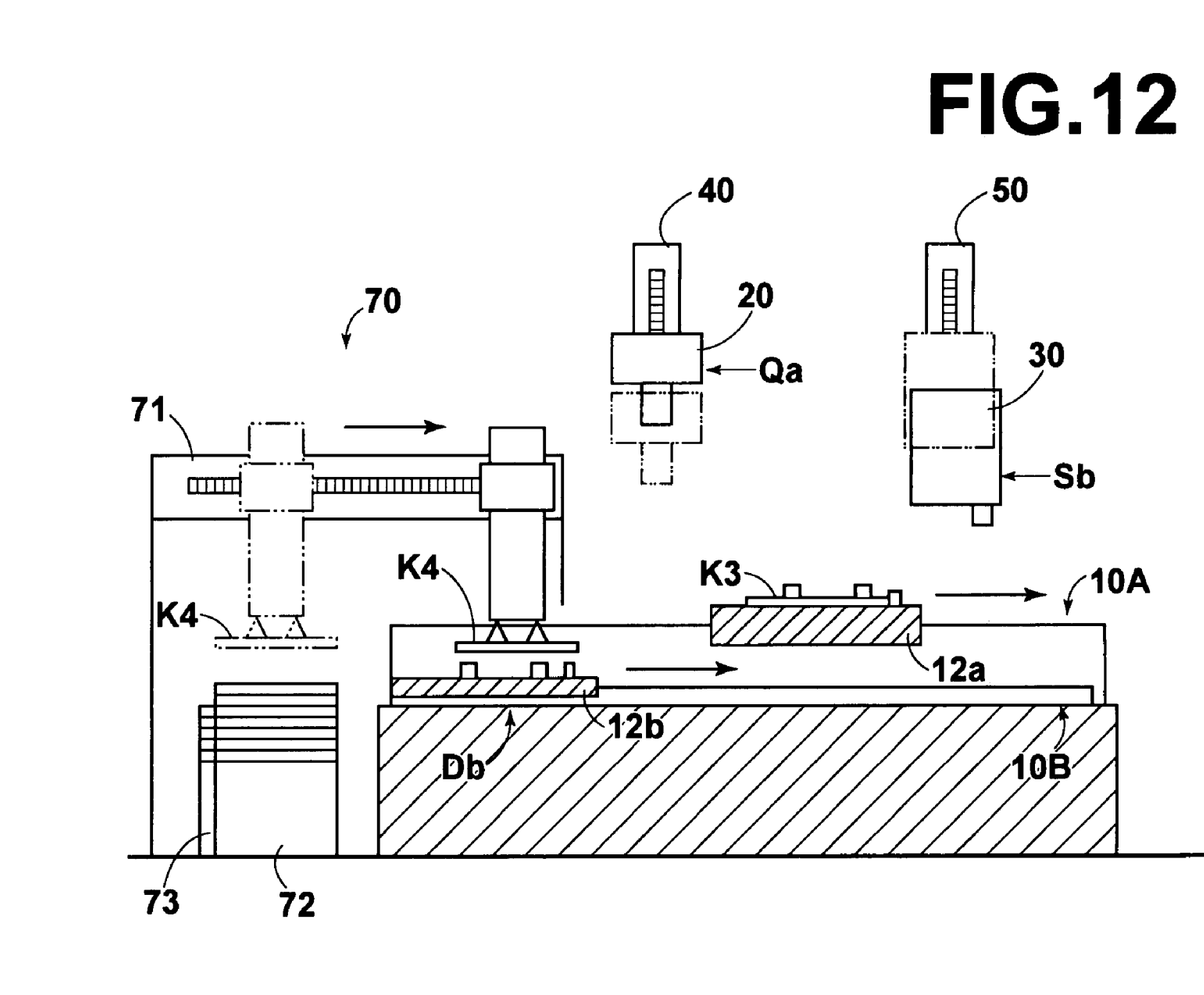
FIG. 12 is a view showing a step in the substrate exposure process by the substrate exposure system.
Figure 13:
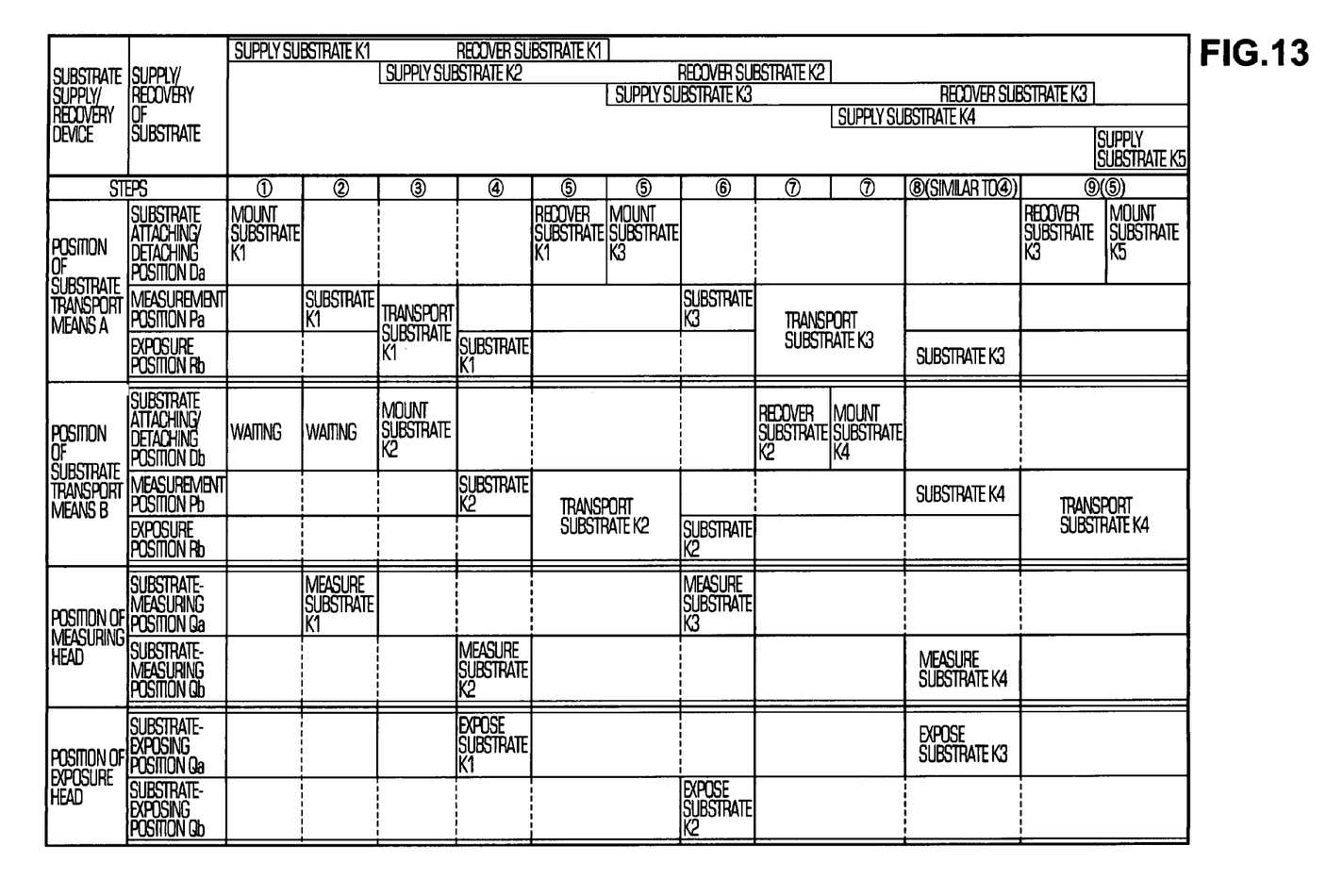
FIG. 13 is a process chart sequentially showing steps in the substrate exposure process by the substrate exposure system.

As shown in FIG. 12, the transport arm unit 71, which has recovered the substrate K2 into the recovery stocker 73, thereafter vacuum-holds the next substrate K4, which is stacked in the stocker 72, with the vacuum holding unit 74 to take the substrate K4 out of the supply stocker 72. Then, the substrate K4 is transported to the transport table 12b positioned at the substrate attaching/detaching position Db and placed at the predetermined position while being touched to the three reference pins 23b on the transport table 12b. The transport table 12b vacuum-holds the substrate K4 placed at the predetermined position, and the substrate K4 is fixed on the transport table 12b.

<Transport to Measurement Position Pb for Substrate K4>

After that, the transport table 12b having the substrate K4 vacuum-held and fixed at the predetermined position is transported along the rails 11b by the drive of the table-driving means to be placed at the measurement position Pb.

<Transport to Exposure Position Ra for Substrate K3>

As shown in the aforementioned FIG. 12, the substrate K3, in which the measurement by the measuring head 20 has been completed, is transported while being vacuum-held and fixed on the transport table 12a to be placed at the exposure position Ra.

Subsequent operations are repetition of the contents described in the above respective sections (4), (5), (6), and (7).

In FIG. 13, a process chart showing the timing of the aforementioned exposure process is shown. Here, the symbols of circled 1, 2, 3, 4, 5, 6, 7, 8, and 9 in this drawing correspond to the contents of the aforementioned respective sections 1, 2, 3, 4, 5, 6, and 7.

As described previously, according to the substrate exposure system, the increase of cost of the system can be suppressed by use of the measuring head and the exposure head in both of two substrate transport means. In addition, the measurement by the measuring head and the exposure by the exposure head can be simultaneously performed on substrates different from each other. Therefore, even when a substrate is being measured by the measuring head, another substrate can be exposed by the exposure head without waiting for the completion of this measurement.

Incidentally, the substrate exposure system can be structured so that the surfaces of respective substrates transported to respective exposure positions of a plurality of substrate transport means may be parallel to each other and that the substrates may overlap each other in the direction perpendicular to the surfaces of the respective substrates. Here, the phrase "the substrates overlap each other in the direction perpendicular to the surfaces of the respective substrates" means that almost the entire faces of the respective substrates overlap in the direction perpendicular to the surfaces of the respective substrates. In this case, the substrate exposure system is structured so that the surfaces of the respective substrates K1 and K2 transported to the respective exposure positions Ra and Rb of the substrate transport units 10A and 10B may be parallel to each other and that the substrates may overlap each other in the direction perpendicular to the surfaces of the respective substrates, i.e., in the exposing direction L1 of the exposure head 30.

Moreover, in the aforementioned embodiment, an example structured so that respective substrates transported to respective measurement positions of a plurality of substrate transport means may overlap in the exposing direction of an exposure head has been illustrated. However, the positional relationship between the respective substrates transported to the respective measurement positions of the plurality of substrate transport means may be any positional relationship. For example, the substrate exposure system may be structured so that the surfaces of the respective substrates transported to the respective measurement positions of the plurality of substrate transport means may be lined in the horizontal direction, which is orthogonal to the exposing direction of the exposure head. Further, the number of substrate transport means is not limited to two but may be any number equal to or larger than two (plural).

Furthermore, positional relationship-measuring means for measuring the relative positional relationship between a substrate transported to the measurement position and the measuring head moved to a substrate-measuring position need not necessarily be provided. In addition, exposure position-measuring means for measuring the relative positional relationship between a substrate transported to the exposure position and the exposure head moved to a substrate-exposing position also need not necessarily be provided.

Further, the substrate may be a printed circuit board, a substrate for a display, such as a liquid crystal display or a plasma display, or the like.

What is claimed is:

1. A substrate exposure system comprising:
    a plurality of substrate transport means each of which sequentially transports one substrate to be a subject of exposure to a measurement position and an exposure position;
    one measuring head for measuring the substrate transported to the measurement position;
    one exposure head for exposing the substrate transported to the exposure position;
    measuring head-moving means for moving the measuring head to respective substrate-measuring positions for the respective substrates transported to the respective measurement positions of the plurality of substrate transport means; and exposure head-moving means for moving the exposure head to respective substrate-exposing positions for the respective substrates transported to the respective exposure positions of the plurality of substrate transport means.

2. The substrate exposure system according to claim 1, wherein surfaces of the respective substrates transported to the respective exposure positions of the plurality of substrate transport means overlap in an exposing direction of the exposure head.

3. The substrate exposure system according to claim 1, further comprising: positional relationship-measuring means for measuring a relative positional relationship between the substrate transported to the measurement position and the measuring head moved to the substrate-measuring position.

4. The substrate exposure system according to claim 2, further comprising: positional relationship-measuring means for measuring a relative positional relationship between the substrate transported to the measurement position and the measuring head moved to the substrate-measuring position.

5. The substrate exposure system according to claim 1, further comprising: exposure position-measuring means for measuring a relative positional relationship between the substrate transported to the exposure position and the exposure head moved to the substrate-exposing position.

6. The substrate exposure system according to claim 2, further comprising: exposure position-measuring means for measuring a relative positional relationship between the substrate transported to the exposure position and the exposure head moved to the substrate-exposing position.

* * * * *